US011557350B2

(12) United States Patent
Bazarsky et al.

(10) Patent No.: US 11,557,350 B2
(45) Date of Patent: Jan. 17, 2023

(54) DYNAMIC READ THRESHOLD CALIBRATION

(71) Applicant: Western Digital Technologies, Inc., San Jose, CA (US)

(72) Inventors: Alexander Bazarsky, Holon (IL); Eran Sharon, Rishon Lezion (IL); Idan Alrod, Herzliya (IL)

(73) Assignee: Western Digital Technologies, Inc., San Jose, CA (US)

(*) Notice: Subject to any disclaimer, the term of this patent is extended or adjusted under 35 U.S.C. 154(b) by 48 days.

(21) Appl. No.: 17/211,602

(22) Filed: Mar. 24, 2021

(65) Prior Publication Data

US 2022/0122674 A1    Apr. 21, 2022

Related U.S. Application Data

(60) Provisional application No. 63/092,731, filed on Oct. 16, 2020.

(51) Int. Cl.
*G11C 16/26* (2006.01)
*G06F 11/10* (2006.01)
*G11C 11/56* (2006.01)

(52) U.S. Cl.
CPC ......... *G11C 16/26* (2013.01); *G06F 11/1068* (2013.01); *G11C 11/5642* (2013.01)

(58) Field of Classification Search
None
See application file for complete search history.

(56) References Cited

U.S. PATENT DOCUMENTS

| 10,573,395 B1* | 2/2020 | Yang | G11C 16/0483 |
| 10,726,929 B1* | 7/2020 | Yang | G11C 16/3459 |
| 2007/0279982 A1* | 12/2007 | Shibata | G11C 11/5642 365/185.21 |
| 2010/0149868 A1 | 6/2010 | Yoo et al. | |

FOREIGN PATENT DOCUMENTS

| JP | 2007323731 A | 12/2007 | |
| JP | 5095131 B2 * | 12/2012 | G11C 11/5642 |

* cited by examiner

*Primary Examiner* — Cynthia Britt
*Assistant Examiner* — Matthew W Wahlin
(74) *Attorney, Agent, or Firm* — Patterson & Sheridan, LLP; Steven H. VerSteeg

(57) ABSTRACT

A method and apparatus for calibrating read threshold for cells of a target wordline (WL) that may be conducted on a die, in a controller connected to a memory die, or both. Voltage values of one or more adjacent WL cells are read, and based on the voltage values of the adjacent cells, cells of the target WL are grouped. A read threshold calibration is carried out on each group. The calibration thresholds are then used for read operations on the cells of each distinct group of the target WL.

20 Claims, 4 Drawing Sheets

DYNAMIC READ THRESHOLD CALIBRATION

CROSS-REFERENCE TO RELATED APPLICATIONS

This application claims benefit of U.S. Provisional Patent Application Ser. No. 63/092,731, filed Oct. 16, 2020, which is herein incorporated by reference.

BACKGROUND OF THE DISCLOSURE

Field of the Disclosure

Embodiments of the present disclosure generally relate to error correction capability of data stored in non-volatile memory cells, and more particularly to calibration of wordline (WL) read thresholds.

Description of the Related Art

As memory demands of electronic devices increase, memory cells become increasingly compact, and interference by the electrical signals in adjacent cells when reading a target cell becomes increasingly difficult to overcome. As a result, bit error rates (BERs) are prone to increase.

In current approaches, there are a number of methods to mitigate the effect of the adjacent cells. For example, such approaches at the die level may include Look Ahead and Dynamic Look Ahead read. In another example, other approaches at the controller level may include Equalization. These methods involve applying additional reads of cells in adjacent wordlines (WL) voltage when reading target WL cells, then the target WL's read voltage is corrected according to the adjacent WL voltage. These mitigation methods have a limited impact on reducing BER. Another current approach that has a more meaningful impact on reducing BER involves read threshold calibration of a target WL based on cell data from the target WL. However, in current approaches read threshold calibration is performed without regard to the state of an adjacent WL.

What is needed are methods and systems for improving read threshold calibration to mitigate the effect of adjacent WLs on cells of a target WL.

SUMMARY OF THE DISCLOSURE

The present disclosure generally relates to methods and systems for calibrating read threshold for cells of a target wordline (WL), that may be conducted on a die, in a controller connected to a memory die, or both. Voltage values of one or more adjacent WL cells are read, and based on the voltage values of the adjacent cells, cells of the target WL are grouped. A read threshold calibration is carried out on each group. The calibration thresholds are then used for read operations on the cells of each distinct group of the target WL.

In one embodiment, a data storage device is disclosed, the data storage device including a non-volatile memory (NVM) and a controller coupled to the NVM and configured to execute a method for memory cell read calibration. The method includes identify a first cell of a plurality of cells of a target wordline (WL) of the NVM, read a voltage of a first adjacent cell of an adjacent WL, physically adjacent to the first cell, and calibrate a first read threshold of the first cell based on the voltage.

In another embodiment, a controller for a data storage device is disclosed that includes an I/O to one or more non-volatile memories (NVMs), and a processor configured to perform a method for dynamic read threshold calibration of one or more memory cells of the one or more NVM. In embodiments the method includes reading a first voltage a first group of cells from a first wordline (WL) of the one or more NVMs, classifying a second group of cells of a second WL of the one or more NVMs based on the first voltage, and calibrating the second group of cells based on first voltage with a first calibrated read threshold.

In another embodiment, a system for storing data is disclosed, that includes a non-volatile memory means and a controller means comprising a processor and memory comprising computer-readable instructions for executing a method for dynamic read calibration, the controller means coupled to the non-volatile memory means. In embodiments, the method includes measuring a first voltage from a first group of cells of a first wordline (WL), measuring a second voltage from a second group of cells of a second WL adjacent the first WL, equalizing the second voltage based on the first voltage, detecting an error in the second voltage, and calibrating a read threshold of the second voltage based on the first voltage.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to methods and systems for calibrating read threshold for cells of a target wordline (WL), that may be conducted on a die, in a controller connected to a memory die, or both. Voltage values of one or more adjacent WL cells are read and based on the voltage values of the adjacent cells, cells of the target WL are grouped. A read threshold calibration is carried out on each group. The calibration thresholds are then used for read operations on the cells of each distinct group of the target WL.

Figure 1:
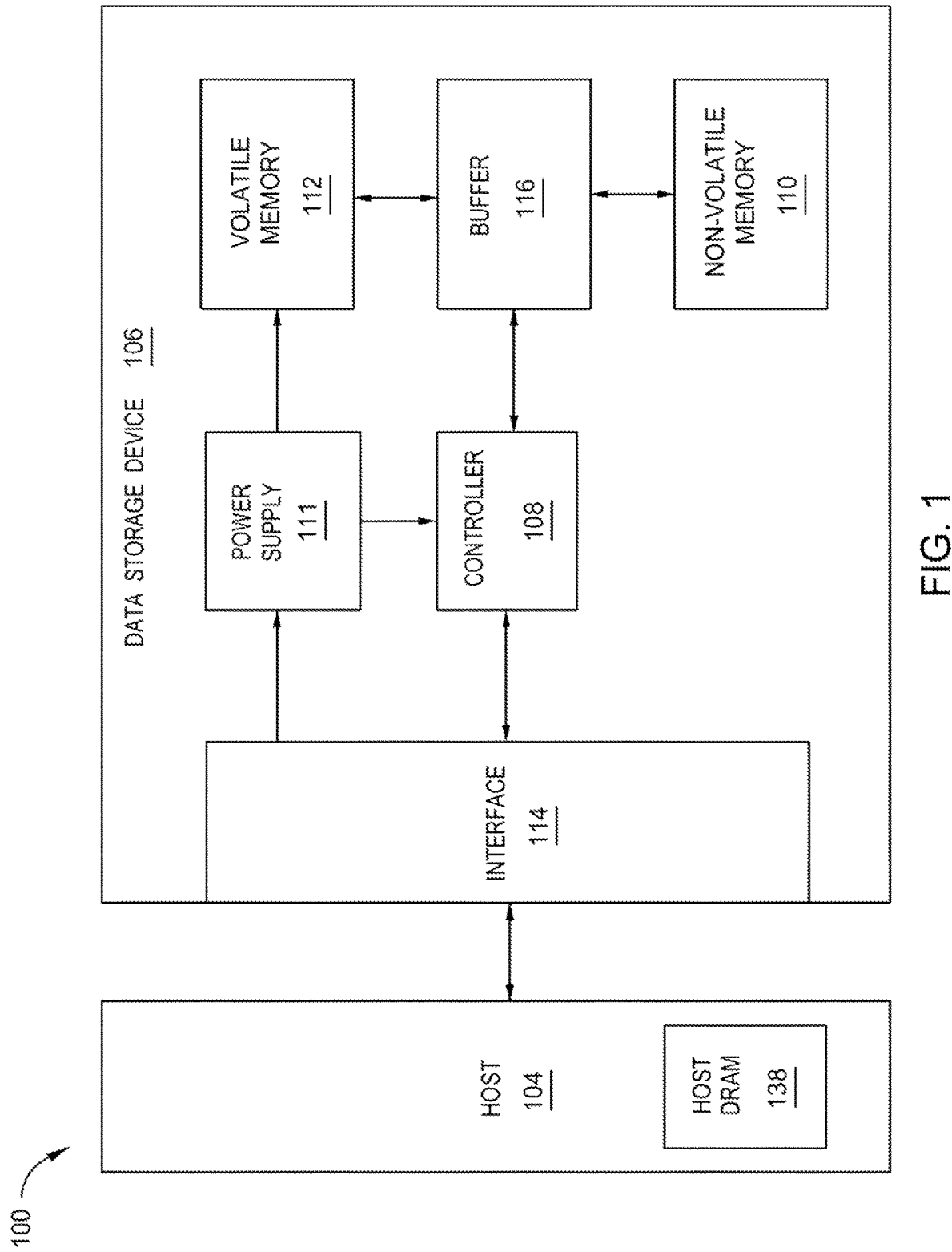
FIG. 1 is a schematic block diagram illustrating a storage system in which a data storage device may function as a storage device for a host device, according to disclosed embodiments.

FIG. 1 is a schematic block diagram illustrating a storage system 100 in which data storage device 106 may function as a storage device for a host device 104, according to disclosed embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, an interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The NVM 110 may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit of NVM 110 may receive a message from the controller 108 that instructs the memory unit to retrieve data. In some examples, each of the memory units may be referred to as a die. In some examples, a single physical chip may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The data storage device 106 includes a power supply 111, which may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, supercapacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may include one or more volatile memory devices. In some examples, the controller 108 may use volatile memory 112 as a cache. For instance, the controller 108 may store cached information in volatile memory 112 until cached information is written to non-volatile memory 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The data storage device 106 includes a controller 108, which may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic to the NVM 110. In some embodiments, when the data storage device 106 receives a write command from the host device 104, the controller 108 temporarily stores the data associated with the write command in the internal memory or write buffer 116 before sending the data to the NVM 110.

Figure 2:
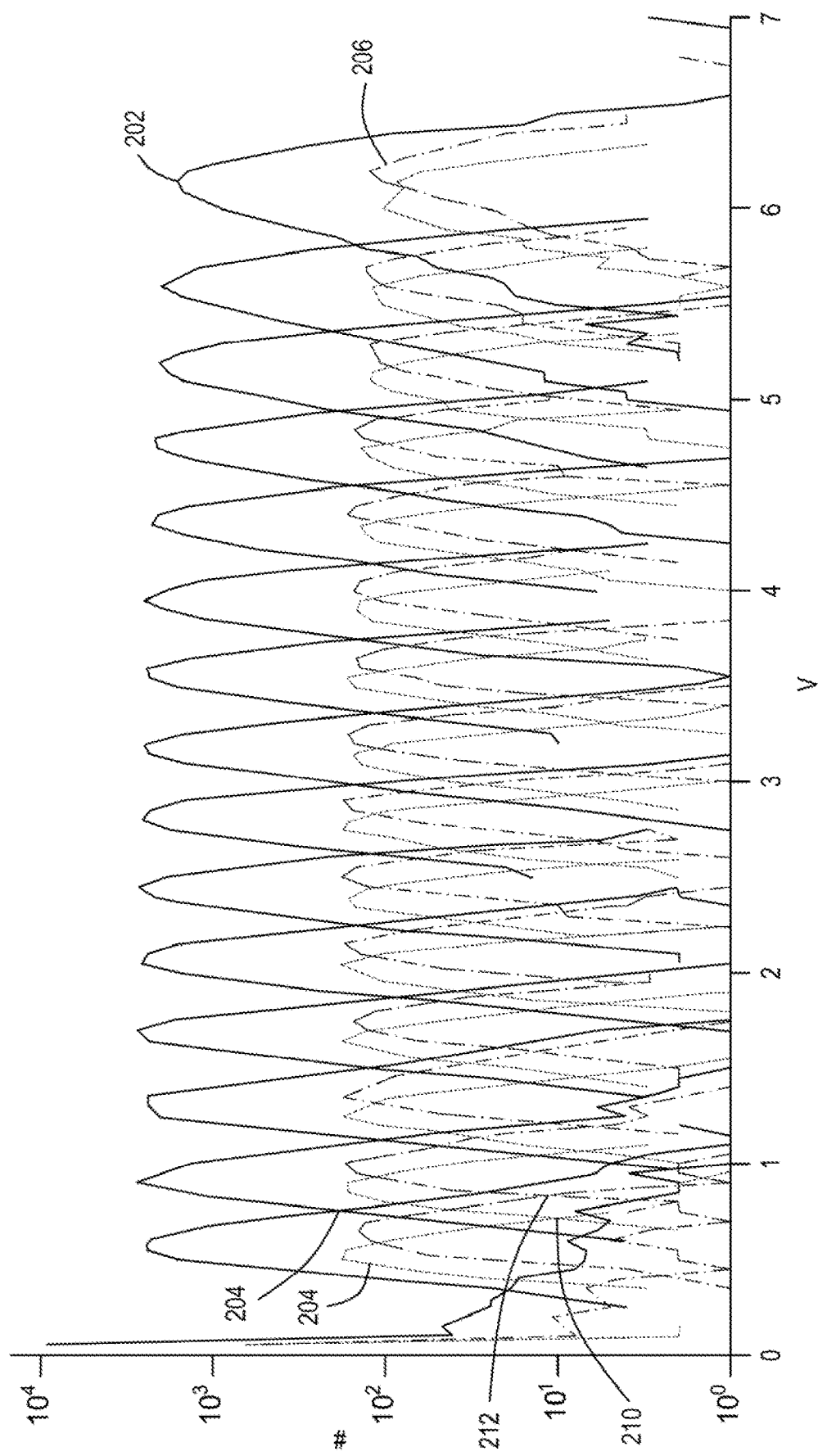
FIG. 2 is a histogram illustrating the voltage states of a memory cell and of adjacent memory cells, according to disclosed embodiments.

FIG. 2 is a histogram 200 illustrating the voltage states of a memory cell and of adjacent memory cells, according to disclosed embodiments. The memory cell and the adjacent memory cells may be the memory cells of a non-volatile memory, such as the NVM 110 of FIG. 1. The histogram 200 illustrates a first curve 202 of the voltage states of all the memory cells of a target wordline, a second curve 204 of the voltage states the target wordline according to an adjacent wordline taken at a low reading, and a third curve 206 of the voltage states of the target wordline according to an adjacent wordline taken at a high reading. A low reading may refer to reading the adjacent wordline at a low voltage and a high reading may refer to reading the adjacent wordline at a high voltage, where the low voltage refers to a first half of the voltage state distribution and the high voltage refers to a second half of the voltage state distribution. The voltages of the first half of the voltage state distribution is substantially less than the voltages of the second half of the voltage state distribution.

Because the first curve 202, the second curve 204, and the third curve 206 illustrates 15 signals, the histogram 200 is illustrating a QLC memory cell that includes 4 bits per memory cell, where the 15 signals refers to the 15 programmable voltage states. The QLC memory cell has an additional voltage state, "Erased (Er)", where the "Er" voltage state is located on the negative x-axis. The number of states that the QLC memory cell may be calculated using the following formula: $2^n$=number of voltage states, where "n" refers to the number of bits per memory cell. It is to be understood that while QLC memory has been exemplified, it is contemplated that the embodiments described herein may be applicable to other iterations of multi-level cell memories, such as SLC, MLC, TLC, and the like.

Furthermore, the intersections of each signal represented by the first curve 202, the second curve 204, and the third curve 206 reflect local minima that illustrate the various read thresholds of the voltage states of the target wordline. For example, regarding the first voltage state and the second voltage state, where the voltage states are increasing in order in the positive x-direction, of the first curve 202, the intersection of the first voltage state and the second voltage state, indicated by a first point 208, is the read threshold for the second voltage state. The same analysis may be applied to the second curve 204 and the third curve 206 to determine a range of read thresholds. For a target wordline (WL), the read threshold for each of the plurality of voltage states may depend on where the read threshold determination is taken. For example, a second point 210 illustrates the read threshold for the second voltage state according to the second curve 204, and a third point 212 points to the read threshold for the second voltage state according to the third curve 206.

When programing to the memory cells of a wordline, such as a target wordline, the electrical interference of programming the target wordline on the adjacent wordlines may affect the adjacent wordlines by causing bit flips and cause a higher bit error rate (BER). Furthermore, during the life of the data storage device, the read thresholds of the memory cells may shift due to wear and tear, program and erase cycles, and the like. By knowing the information regarding the adjacent wordline voltage state, the BER may be effectively reduced. Such methods to determine the information about the adjacent wordline voltage state may be look-ahead (LA) and dynamic look-ahead (DLA). The LA method and the DLA method may be equalization schemes utilized at the die level or at the controller level of a data storage device, such as the data storage device 106 of FIG. 1.

The LA method includes reading the voltage of the target wordline and reading the voltage of the adjacent wordlines. After reading the target wordline and the adjacent wordlines, the voltage of the target wordline is determined based on the voltage of the adjacent wordline, such that an expected read threshold of the target wordline is calibrated to match the actual read threshold of the target wordline. Likewise, the DLA method includes reading the voltage of both the target wordline and the adjacent wordlines. A VREADK voltage is applied to the adjacent wordline, where the VREADK voltage may be greater than the voltage of the target wordline. In both the LA method and the DLA method, the voltage of the target wordline is adjusted to the voltage of the adjacent wordline, where the voltage of the adjacent wordline is either a high voltage value or a low voltage value, and the high voltage value or the low voltage value is used to determine the actual read threshold of the target wordline.

By calibrating read thresholds separately for each group of cells according to the voltage of the adjacent wordline, the error correction capability and the read threshold calibration may be improved. For example, Table 1 below illustrates several examples, where a first example is a reference scheme, and the following examples utilize different equalization schemes.

TABLE 1

| Scheme | CER [%] | Mean Sigma [mv] | Margin [mv] |
| --- | --- | --- | --- |
| Reference | 2.39 | 89 | 0 |
| 1b (WLn + 1) DLA | 1.94 | 85.3 | 277 |
| 1b (WLn + 1) + 1b (WLn − 1) DLA | 1.74 | 82.8 | 465 |
| 2b (WLn + 1) DLA | 1.81 | 84 | 375 |

In Table 1, the "b" refers to the number of bits, such that "1b" refers to 1 bit and "2b" refers to 2 bits. The "1b" refers to correcting the voltage of the target voltage based on 1 bit of the adjacent wordline. Likewise, the "2b" refers to correcting the voltage of the target voltage based on 2 bits of the adjacent wordline. Furthermore, "WLn+1" is the next adjacent wordline and the "WLn−1" is the previous adjacent wordline. The cell error rate (CER) are the percentage of cells that are in error under the proposed scheme. The mean sigma is the standard deviation from a mean value, where a smaller mean sigma value results in a better correction capability. Furthermore, the margin is the error margin based on the difference of the mean sigma from the reference. In general, lower values for CER and mean sigma are improvements from the reference, and larger margin exemplifies a greater improvement than that of a smaller margin. As shown in Table 1, the 1b (WLn+1)+1 b (WLn−1) DLA scheme results in the lowest CER of about 1.74%, the lowest mean sigma of about 82.8 my, and the highest margin of about 465 my when compared to that of the reference scheme, the 1b (WLn+1) DLA scheme, and the 2b (WLn+1) DLA scheme.

In order to increase the error correction capability and produce a more accurate read threshold calibration for the target wordline by taking into account the voltage of the adjacent wordlines, a dynamic read threshold calibration may be utilized. The dynamic read threshold calibration includes identifying a number of groups of target wordline cells sharing identical or similar adjacent cells, performing individual read threshold calibrations on each of the identified groups of target wordline cells, and utilizing the calibrated read thresholds to read from each of the identified groups of target wordline cells.

The number of groups may be classified by the number of bits used for the LA method or the DLA method. It is contemplated that that other equalization schemes other than the LA method or the DLA method are applicable to the embodiments described herein. The number of groups may be calculated using the following formula: Number of groups=$2^x$, where "x" refers to the number of bits and the number of groups is divided in half to determine the number of groups for a high voltage value of the adjacent wordline and the number of groups for a low voltage value of the adjacent wordline. For example, when using 1 bit on the adjacent wordline, the number of groups is $2^1$ or 2, where a first group is associated with the high voltage value of the adjacent wordline, and a second group is associated with the low voltage value of the adjacent wordline.

When performing the read threshold calibration, the read threshold calibration may be conducted in parallel for groups that are distinct from each other. Otherwise, the read threshold calibration may be conducted sequentially for groups that are not distinct from each other. The calibrated read thresholds are then used to read each of the groups of cells of the target wordline. The read to each of the groups of cells of the target wordline may be completed in parallel or individually. Alternatively, the read may be issued on a per-group basis that includes a mask that filters only the cells that correspond to the relevant group, such that the relevant calibrated read thresholds are utilized. Table 2, shown below, includes a reference example and several examples of different embodiments of the dynamic read threshold calibration approach.

TABLE 2

| WL(+1) + WL(−1) | CER [%] | Mean Sigma [mv] | Margin [mv] |
| --- | --- | --- | --- |
| Reference | 2.39 | 89 | 0 |
| 2 + 8 Groups | 1.61 | 81.9 | 532 |
| 4 + 4 Groups | 1.51 | 80.9 | 607 |
| 8 + 2 Groups | 1.5 | 81.2 | 585 |

Like Table 1, lower values for CER and mean sigma are improvements from the reference, and larger margin exemplifies a greater improvement than that of a smaller margin. Referring to Table 2, WL(+1)+WL(−1) describes the number of bits on the next adjacent neighbor and the number of bits on the previous adjacent neighbor. For example, the "2+8 Groups" refers to 1 bit (i.e., $2^1$) on the next adjacent neighbor and 3 bits (i.e., $2^3$) on the previous adjacent neighbor. Comparing the results of Table 2 to Table 1, the improvement is greater than the equalization schemes of Table 1 and applies the 1b (WLn+1)+1b (WLn−1) DLA scheme in a greater depth. As described above, the correct identification of groups may result in improved read threshold calibrations.

For example, the WL(+1)+WL(−1) scheme groups the adjacent bits or adjacent cells according to the voltage state of the adjacent wordlines. In the description herein, the term "bits" and the term "cells" may be used interchangeably, for exemplary purposes. At least one of the adjacent wordlines is the next wordline and the other one of the adjacent wordlines is the previous wordline. Furthermore, the voltage applied to the next adjacent wordline may be different from the voltage applied to the target wordline. The voltage applied to the previous adjacent wordline may be the same as the voltage applied to the next adjacent wordline or different from both the voltage applied to the next adjacent wordline and voltage applied to the the target wordline.

Figure 3:
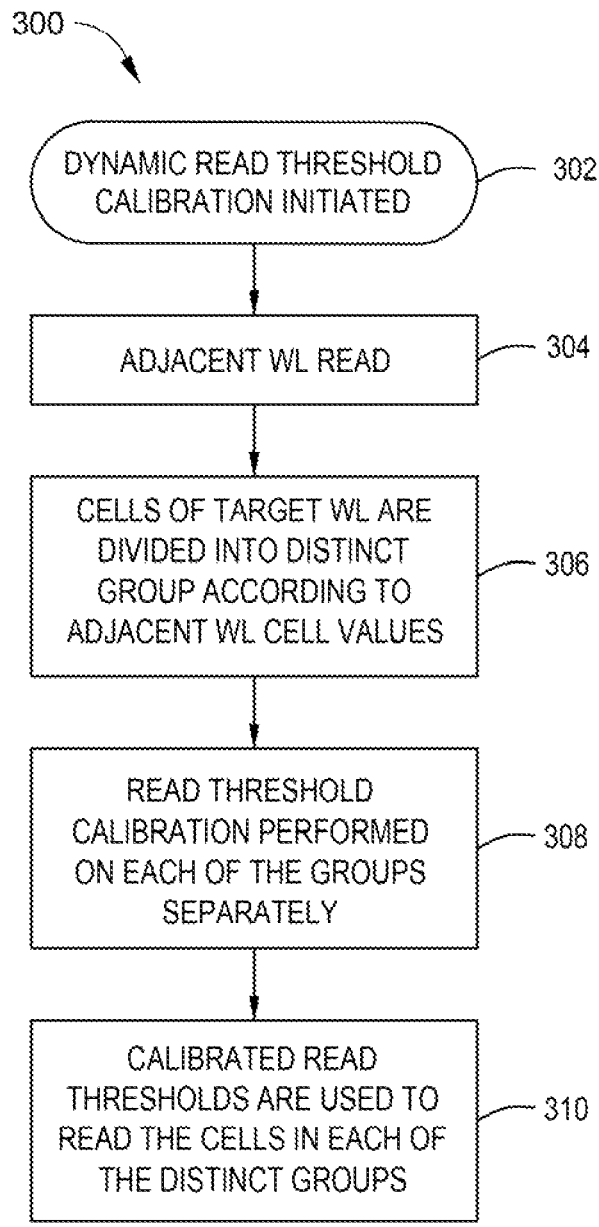
FIG. 3 is a flowchart illustrating a method of dynamic read threshold calibration, according to disclosed embodiments.

FIG. 3 is a flowchart illustrating a method 300 of dynamic read threshold calibration, according to disclosed embodiments. At block 302, the dynamic read threshold calibration operation is initiated. At block 302, a first cell and a second cell of a plurality of cells of a target wordline of the NVM, such as the NVM 110 of FIG. 1, may be identified. At block 304, an adjacent wordline read is conducted, where the read includes reading a voltage of a first adjacent cell, a second adjacent cell, and a third adjacent cell of the adjacent wordline, where the first adjacent cell is physically adjacent to the first cell and the second adjacent cell is physically adjacent to the second cell. The adjacent wordline read includes reading the next adjacent wordline and the previous adjacent wordline.

At block 306, the cells of the target wordline are divided into distinct groups according to the adjacent wordline cell values, where the adjacent wordline cell values are the voltage values of the adjacent wordlines. The distinct groups may be the groups exemplified in Table 2 based on the voltages of the groups of cells. For example, a first group of cells from a first wordline may have a first voltage. A group of cells of a second wordline may be classified as a second group of cells based on the first voltage, where the second group of cells has a different voltage than the first group of cells. Furthermore, the first wordline may be the next adjacent wordline and the second wordline may be the previous adjacent wordline, or vice-versa.

At block 308, a read threshold calibration operation is performed on each of the groups separately. In another embodiment, the read threshold calibration operation may be performed on the groups in parallel. During the read threshold calibration operation, a plurality of voltages for the target wordline is read. The read threshold calibration operation may utilize the dynamic read threshold calibration scheme described in FIG. 2 and exemplified in Table 2. The first read threshold of the first cell or the first group of cells is calibrated based on a first voltage of the adjacent first cell. Likewise, the second read threshold of the second cell or the second group of cells is calibrated based on a second voltage of the adjacent second cell. The first read threshold may be different from the second read threshold.

At block 310, the calibrated read thresholds, determined at block 308, are used to read the cells in each of the distinct groups. For example, a target voltage of the first cell may be read. The controller may utilize the calibrated read threshold for the first cell to correct the target voltage based on the difference between the voltage read and the calibrated read threshold voltage if a read error is identified. The read error may be identified by decoding an error correction code (ECC), where the reading of the first cell may be performed by applying a VREADK voltage at the first cell. The VREADK voltage may shutdown adjacent wordlines, such that only the data of the target wordline is read.

In some examples, one or more groups of cells on adjacent wordlines may have the same calibrated read thresholds. For example, a first group of cells from a first wordline and a second group of cells of a second wordline may have the same calibrated read thresholds, where the calibrated read threshold is a first calibrated read threshold. Likewise, a third group of cells from the first wordline and a fourth group of cells from the second wordline may have the same calibrated read thresholds, where the calibrated read threshold is a second calibrated read threshold, and where the fourth group of cells is calibrated based on the voltage of the third group of cells.

When receiving a read command for data of the second wordline, the first calibrated read threshold is applied to the second group of cells and the second calibrated read threshold is applied to the fourth group of cells, where the application of the calibrated read thresholds is applied at approximately at the same time and the reading of the second group of cells and the fourth group of cells are in parallel.

Figure 4:
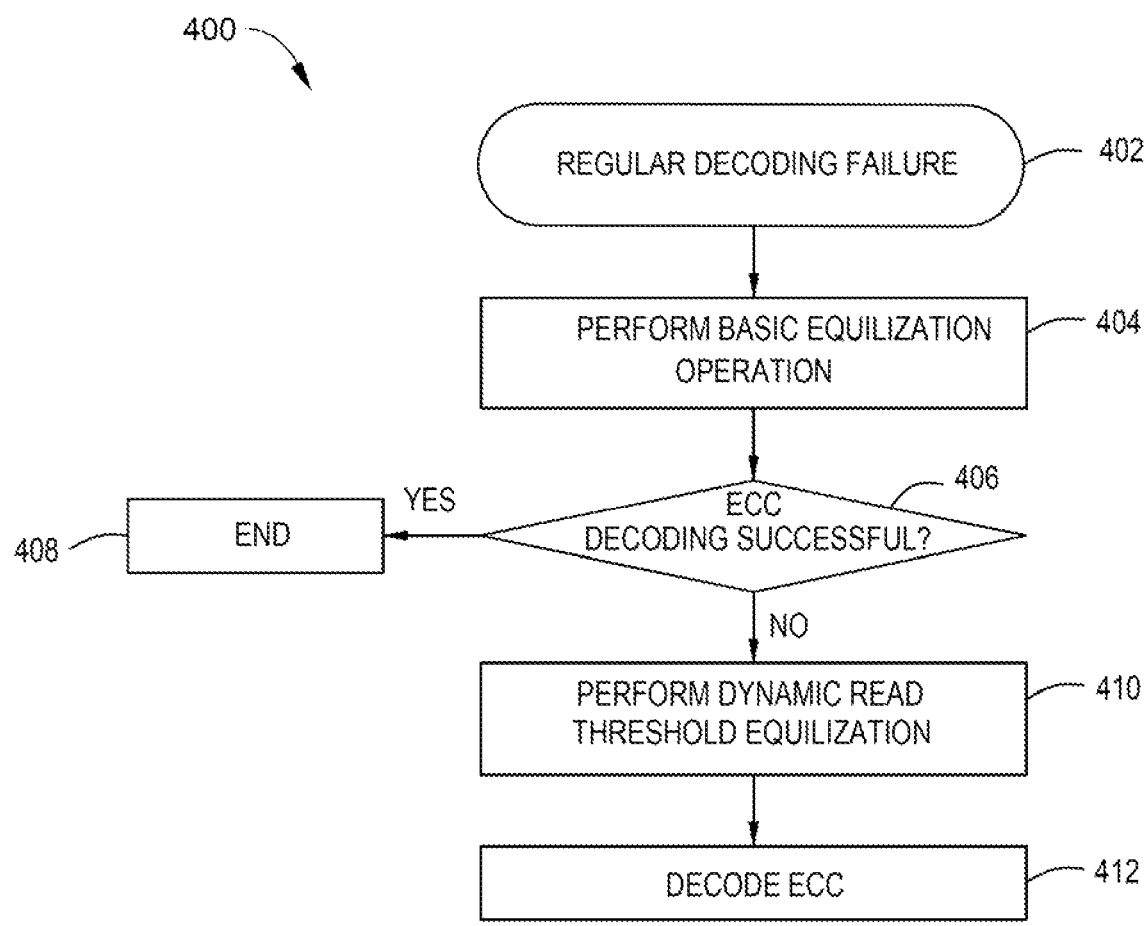
FIG. 4 is a flowchart illustrating a method of performing a dynamic read threshold calibration after a basic equalization operation has failed, according to disclosed embodiments.

FIG. 4 is a flowchart illustrating a method of 400 performing a dynamic read threshold calibration after a basic equalization operation has failed, according to disclosed embodiments. Aspects of the method 300 may be utilized in the method 400. At block 402, a regular decoding failure is detected. At block 404, the basic equalization operation is performed, where the basic equalization operation may be the LA method or the DLA method described in FIG. 2 and in Table 1. At block 406, the controller performs an ECC decode. If the ECC decode is successful at block 406, then the method 400 is completed at block 408.

However, if the ECC decode is unsuccessful at block 406, then at block 410, a dynamic read threshold equalization operation is performed, where the dynamic read threshold equalization operation may be the method 300 described. Furthermore, the dynamic read threshold equalization operation may be the examples described in Table 2 of FIG. 2. Referring to the example of FIG. 3, when the dynamic read threshold equalization operation is performed, the controller may perform a LA or a DLA read on the first group of cells and the second group of cells, where the first group of cells is from a first wordline and the second group of cells is from a second wordline. The first wordline may be the next adjacent wordline and the second wordline may be the previous adjacent wordline, or vice-versa. The LA or the DLA read may include reading the first voltage and the second voltage from the first group of cells and the third group of cells and reading a third voltage from the second group of cells based on the first voltage and the second voltage. The controller determines that the decoding failure is an error in the third voltage. At block 412, the ECC is decoded, where read threshold values for the second group of cells are calibrated based on the third voltage.

By performing a dynamic read threshold equalization operation, the correction capability of data in data storage devices may be improved, such that the reliability of the data storage device under different stress conditions may be improved.

In one embodiment, a data storage device is disclosed, the data storage device including a non-volatile memory (NVM) and a controller coupled to the NVM and configured to execute a method for memory cell read calibration. The method includes identifying a first cell of a plurality of cells of a target wordline (WL) of the NVM, read a voltage of a first adjacent cell of an adjacent WL, physically adjacent to the first cell, and calibrate a first read threshold of the first cell based on the voltage.

The method further includes identifying a second cell of the plurality of cells, reading a second voltage of a second adjacent cell of the adjacent WL, physically adjacent to the second cell, and calibrating a second read threshold of the second cell based on the second voltage. The second read threshold is different from the first read threshold. The method further includes performing a read operation on the first cell based on the first read threshold and the second cell based on the second read threshold. The method further includes reading a target voltage from the first cell and correcting the target voltage based on the voltage. The method further includes identifying a read error in the target voltage using an error correction code (ECC) and applying a VREADK voltage at the first cell.

In another embodiment, a controller for a data storage device is disclosed that includes an I/O to one or more non-volatile memories (NVMs), and a processor configured to perform a method for dynamic read threshold calibration of one or more memory cells of the one or more NVM. In embodiments the method includes reading a first voltage a first group of cells from a first wordline (WL) of the one or more NVMs, classifying a second group of cells of a second WL of the one or more NVMs based on the first voltage, and calibrating the second group of cells based on first voltage with a first calibrated read threshold.

The method further including reading a second voltage from a third group of cells from the first WL, classifying a fourth group of cells of the second WL, and calibrating the fourth group of cells based on the second voltage with a second calibrated read threshold. The calibrating the second group and the fourth group further includes receiving a read command for data of the second WL and applying the first calibrated read threshold and second calibrated read threshold to the second group of cells and the fourth group of cells, respectively. The method further includes applying the first calibrated read threshold and second calibrated read threshold at approximately the same time, and reading from the second group of cells and fourth group of cells in parallel. The method further includes detecting a regular decoding failure and performing a look-ahead read on the first group of cells and the second group of cells. The look-ahead includes reading the first voltage and second voltage from the first group of cells and third group of cells and reading a third voltage from the second group of cells based on the first voltage and second voltage. The method further includes identifying an error in the third voltage.

In another embodiment, a system for storing data is disclosed, that includes a non-volatile memory means and a controller means comprising a processor and memory comprising computer-readable instructions for executing a method for dynamic read calibration, the controller means coupled to the non-volatile memory means. In embodiments, the method includes measuring a first voltage from a first group of cells of a first wordline (WL), measuring a second voltage from a second group of cells of a second WL adjacent the first WL, equalizing the second voltage based on the first voltage, detecting an error in the second voltage, and calibrating a read threshold of the second voltage based on the first voltage.

The method further including measuring a third voltage from a third group of cells of the first WL and measuring a fourth voltage from a fourth group of cells of the second WL. The method further includes calibrating a second read threshold of the fourth voltage based on the third voltage. The method further includes receiving a read request from a host for the second group of cells and fourth group of cells and reading a plurality of voltages from the second and fourth group of cells using the calibrated read threshold and second calibrated read threshold. The method further includes measuring a fifth voltage of a fifth group of cells of a third WL, the third WL adjacent the second WL. The method further includes calibrating a third read threshold of the second voltage based on the fifth voltage.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
   a non-volatile memory (NVM); and
   a controller coupled to the NVM and configured to execute a method for memory cell read calibration, the method comprising:
   identify a first cell of a plurality of cells of a target wordline (WL) of the NVM;
   read a voltage of a first adjacent cell of an adjacent WL, physically adjacent to the first cell; and
   calibrating a first read threshold of the first cell based on the voltage, wherein the calibrating comprises:
   reading a plurality of voltages for the target WL, wherein the plurality of voltages are a first curve, and second curve, and a third curve; wherein the first curve is a voltage status of all memory cells of the target WL; wherein the second curve is a voltage status of the target WL according to the adjacent WL at a low reading; wherein the third curve is a voltage status of the target WL according to the adjacent WL at a high reading; and wherein an intersection of each signal represented by the curves reflects a minima of the first read threshold.

2. The data storage device of claim 1, the method further comprising:
   identifying a second cell of the plurality of cells;
   reading a second voltage of a second adjacent cell of the adjacent WL, physically adjacent to the second cell; and
   calibrating a second read threshold of the second cell based on the second voltage.

3. The data storage device of claim 2, wherein the second read threshold is different from the first read threshold.

4. The data storage device of claim 3, the method further comprising performing a read operation on the first cell based on the first read threshold and the second cell based on the second read threshold.

5. The data storage device of claim 1, the method further comprising:
   reading a target voltage from the first cell; and
   correcting the target voltage based on the voltage.

6. The data storage device of claim 5, the method further comprising:
   identifying a read error in the target voltage using an error correction code (ECC).

7. The data storage device of claim 6, further comprising applying a READ voltage at the first cell.

8. A controller for a data storage device, comprising:
   an I/O to one or more non-volatile memories (NVMs); and
   a processor configured to perform a method for dynamic read threshold calibration of one or more memory cells of the one or more NVM, the method comprising:
   reading a first voltage of a first group of cells from a first wordline (WL) of the one or more NVMs;
   classifying a second group of cells of a second WL of the one or more NVMs based on the first voltage; and
   calibrating the second group of cells based on the first voltage with a first calibrated read threshold, wherein the first calibrated read threshold is determined by:
   reading a plurality of voltages for the first WL, wherein the plurality of voltages are a first curve, and second curve, and a third curve; wherein the first curve is a voltage status of all memory cells of the first WL; wherein the second curve is a voltage status of the first WL according to an adjacent WL at a low reading; wherein the third curve is a voltage status of the first WL according to the adjacent WL at a high reading; and wherein an intersection of each signal represented by the curves reflects a minima of the first calibrated read threshold.

9. The controller of claim 8, the method further comprising:
   reading a second voltage from a third group of cells from the first WL;
   classifying a fourth group of cells of the second WL; and
   calibrating the fourth group of cells based on the second voltage with a second calibrated read threshold.

10. The controller of claim 9, wherein calibrating the second group and the fourth group further comprises:
  receiving a read command for data of the second WL; and
  applying the first calibrated read threshold and second calibrated read threshold to the second group of cells and the fourth group of cells, respectively.

11. The controller of claim 9, the method further comprising applying the first calibrated read threshold and second calibrated read threshold at approximately the same time, and reading from the second group of cells and fourth group of cells in parallel.

12. The controller of claim 9, the method further comprising:
  detecting a regular decoding failure; and
  performing a look-ahead read on the first group of cells and the second group of cells.

13. The controller of claim 12, wherein the look-ahead comprises:
  reading the first voltage and second voltage from the first group of cells and third group of cells; and
  reading a third voltage from the second group of cells based on the first voltage and second voltage.

14. The controller of claim 13, the method further comprising identifying an error in the third voltage.

15. A system for storing data, comprising:
  a non-volatile memory means; and
  a controller comprising a processor and memory comprising computer-readable instructions for executing a method for dynamic read calibration, the controller coupled to the non-volatile memory means, the method comprising:
    measuring a first voltage from a first group of cells of a first wordline (WL);
    measuring a second voltage from a second group of cells of a second WL adjacent the first WL, equalizing the second voltage based on the first voltage;
    detecting an error in the second voltage; and
    calibrating a read threshold of the second voltage based on the first voltage, wherein the calibrating comprises:
      reading a plurality of voltages for a target WL, wherein the plurality of voltages are a first curve, and second curve, and a third curve; wherein the first curve is a voltage status of all memory cells of the target WL; wherein the second curve is a voltage status of the target WL according to an adjacent WL at a low reading; wherein the third curve is a voltage status of the target WL according to the adjacent WL at a high reading; and wherein an intersection of each signal represented by the curves reflects a minima of the read threshold.

16. The system of claim 15, the method further comprising:
  measuring a third voltage from a third group of cells of the first WL; and
  measuring a fourth voltage from a fourth group of cells of the second WL.

17. The system of claim 16, the method further comprising:
  calibrating a second read threshold of the fourth voltage based on the third voltage.

18. The system of claim 17, the method further comprising:
  receiving a read request from a host for the second group of cells and fourth group of cells; and
  reading a plurality of voltages from the second and fourth group of cells using the calibrated read threshold and second calibrated read threshold.

19. The system of claim 18, the method further comprising:
  measuring a fifth voltage of a fifth group of cells of a third WL, the third WL adjacent the second WL.

20. The system of claim 19, the method further comprising:
  calibrating a third read threshold of the second voltage based on the fifth voltage.

* * * * *